(12) United States Patent
Son et al.

(10) Patent No.: US 11,770,636 B2
(45) Date of Patent: Sep. 26, 2023

(54) OPTICAL SENSOR, METHOD OF MANUFACTURING THE SAME, AND DISPLAY DEVICE INCLUDING THE SAME

(71) Applicant: SAMSUNG DISPLAY CO., LTD., Yongin-si (KR)

(72) Inventors: Jung Ha Son, Yongin-si (KR); Gee Bum Kim, Yongin-si (KR); Sang Woo Kim, Yongin-si (KR); Ki June Lee, Yongin-si (KR); Jae Ik Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 399 days.

(21) Appl. No.: 16/928,698

(22) Filed: Jul. 14, 2020

(65) Prior Publication Data
US 2021/0029318 A1    Jan. 28, 2021

(30) Foreign Application Priority Data

Jul. 26, 2019   (KR) ........................ 10-2019-0091281

(51) Int. Cl.
*H04N 25/76*   (2023.01)
*H01L 27/146*   (2006.01)
(Continued)

(52) U.S. Cl.
CPC ....... *H04N 25/76* (2023.01); *H01L 27/14609* (2013.01); *H04N 25/705* (2023.01)

(58) Field of Classification Search
CPC .... H04N 5/374; H04N 5/36965; H04N 25/76; H04N 25/705; H01L 27/14609;
(Continued)

(56) References Cited

U.S. PATENT DOCUMENTS 6,724,012 B2 * 4/2004 Kimura ............ H01L 27/14678
257/85
7,407,846 B2   8/2008 Ando et al.
(Continued)

FOREIGN PATENT DOCUMENTS

KR   10-2004-0105975   12/2004
KR   10-1829673   2/2018
(Continued)

OTHER PUBLICATIONS

S. DiBenedetto, et al., "Molecular Self-Assembled Monolayers and Multilayers for Organic and Unconventional Inorganic Thin-Film Transistor Applications", Adv. Mater., 2009, 21, p. 1407-1433.
(Continued)

*Primary Examiner* — Albert H Cutler
(74) *Attorney, Agent, or Firm* — F. Chau & Associates, LLC

(57) ABSTRACT

An optical sensor including: a substrate; a circuit element layer disposed on the substrate and including a circuit element; and a photoelectric element layer including a photoelectric element, a self-assembled monolayer, and a bias electrode connected to the photoelectric element, wherein the photoelectric element is connected to the circuit element, and wherein the self-assembled monolayer is disposed on the photoelectric element.

11 Claims, 16 Drawing Sheets

(51) Int. Cl.
*H04N 25/705* (2023.01)
*H01L 31/105* (2006.01)
*H01J 1/02* (2006.01)
*H01L 27/142* (2014.01)
*H01L 31/0224* (2006.01)
*H01L 31/18* (2006.01)

(58) Field of Classification Search
CPC ......... H01L 27/14625; H01L 27/14612; H01L 27/14605; H01L 27/14636; H01L 31/105; H01L 27/142; H01L 27/14623; H01L 31/0224; H01L 31/18; H01L 27/14665; H01L 27/14667; H01L 27/14669; H01L 27/1467; G01J 1/02
See application file for complete search history.

(56) References Cited

U.S. PATENT DOCUMENTS

| | | | | |
|---|---|---|---|---|
| 8,883,537 | B2* | 11/2014 | Kudo | H01L 31/18 438/57 |
| 8,941,114 | B2 | 1/2015 | Yamazaki et al. | |
| 2010/0207112 | A1* | 8/2010 | Furst | H01L 51/441 257/E51.012 |
| 2011/0261019 | A1* | 10/2011 | Makita | G06F 3/042 257/E21.24 |
| 2015/0187837 | A1* | 7/2015 | Zhao | H01L 27/14692 438/82 |
| 2018/0150671 | A1 | 5/2018 | Choo et al. | |
| 2018/0301495 | A1* | 10/2018 | Ito | H01L 27/14612 |
| 2022/0262863 | A1* | 8/2022 | Dupoiron | H01L 27/307 |

FOREIGN PATENT DOCUMENTS

| | | |
|---|---|---|
| KR | 10-2018-0061474 | 6/2018 |
| KR | 10-2019-0036194 | 4/2019 |

OTHER PUBLICATIONS

G. Jennings, et al., "Effect of Chain Length on the Protection of Copper by n-Alkanethiols", Langmuir, 1998, 14, p. 6130-6139.

T. Arai, et al. "69.2: Highly Reliable Oxide-Semiconductor TFT for AM-OLED Display", SID Symposium Digest of Technical Papers, 2010, p. 1033-1036.

* cited by examiner

OPTICAL SENSOR, METHOD OF MANUFACTURING THE SAME, AND DISPLAY DEVICE INCLUDING THE SAME

CROSS-REFERENCE TO RELATED APPLICATION

This application claims priority under 35 U.S.C. § 119 to Korean Patent Application No. 10-2019-0091281 filed in the Korean Intellectual Property Office on Jul. 26, 2019, the disclosure of which is incorporated by reference herein in its entirety.

TECHNICAL FIELD

The present invention relates to an optical sensor, a method of manufacturing the optical sensor, and a display device including the optical sensor.

DISCUSSION OF THE RELATED ART

Recently, a display device such as a smartphone or a tablet personal computer (PC) has been utilized in various fields, and thereby, a biometric information authentication method using a fingerprint or the like of a user has been widely used. To provide a fingerprint sensing function, a fingerprint sensor may be provided in a form embedded in or attached to the display device. Such a fingerprint sensor integrated display device is referred to as a fingerprint on display (FoD).

The FoD may be configured as, for example, a photosensitive sensor. For example, a photosensitive FoD uses a light emitting element provided in a pixel as a light source and may include an optical sensor array. The optical sensor array may be configured by, for example, a CMOS image sensor (CIS).

The CMOS image sensor may include a vertical P-Intrinsic-N (PIN) diode. When a small amount of sensing current output from the PIN diode is transmitted to the outside, noise may be generated.

SUMMARY

According to an exemplary embodiment of the present invention, an optical sensor including: a substrate; a circuit element layer disposed on the substrate and including a circuit element; and a photoelectric element layer including a photoelectric element, a self-assembled monolayer, and a bias electrode connected to the photoelectric element, wherein the photoelectric element is connected to the circuit element, and wherein the self-assembled monolayer is disposed on the photoelectric element.

In an exemplary embodiment of the present invention, the photoelectric element includes: a lower electrode connected to the circuit element; a P-Intrinsic-N (PIN) layer disposed on the lower electrode; and an upper electrode disposed on the PIN layer and connected to the bias electrode.

In an exemplary embodiment of the present invention, the photoelectric element layer further includes a protective layer covering the upper electrode, and the bias electrode is formed on the protective layer and is connected to the upper electrode through a contact hole formed in the protective layer.

In an exemplary embodiment of the present invention, the self-assembled monolayer is formed between the protective layer and the bias electrode.

In an exemplary embodiment of the present invention, the PIN layer includes: an N-type semiconductor layer disposed on the lower electrode; an I-type semiconductor layer formed on the N-type semiconductor layer; and a P-type semiconductor layer formed on the I-type semiconductor layer.

In an exemplary embodiment of the present invention, the circuit element layer includes: an active pattern having a channel region, and a source region and a drain region on opposing sides of the channel region, respectively; a gate insulating layer covering the active pattern; a gate electrode formed on the gate insulating layer, wherein at least a part of the gate electrode overlaps the channel region; an interlayer insulating layer covering the gate electrode; a source electrode and a drain electrode formed on the interlayer insulating layer and respectively connected to the source region and the drain region through contact holes; and a protective layer covering the source electrode and the drain electrode.

In an exemplary embodiment of the present invention, the optical sensor further including a planarization layer formed on the photoelectric element layer.

According to an exemplary embodiment of the present invention, a method of manufacturing an optical sensor, including: forming a circuit element layer on a substrate, wherein the circuit element layer includes at least one circuit element; forming a photoelectric element on the circuit element layer, wherein the photoelectric element is connected to the at least one circuit element; forming a protective layer covering the photoelectric element; forming a self-assembled monofilm on the photoelectric element; forming a contact hole in the self-assembled monofilm and the protective layer and forming a bias electrode connected to the photoelectric element through the contact hole.

In an exemplary embodiment of the present invention, the method of manufacturing an optical sensor, further including cleaning the substrate after the contact hole is formed.

In an exemplary embodiment of the present invention, the method of manufacturing an optical sensor, further including performing oxygen plasma treatment of the substrate after the bias electrode is formed.

In an exemplary embodiment of the present invention, the self-assembled monofilm is etched by the oxygen plasma treatment in a region where the bias electrode is not formed.

In an exemplary embodiment of the present invention, the method of manufacturing an optical sensor, further including forming a planarization layer after the oxygen plasma treatment of the substrate is performed, wherein the planarization layer covers the bias electrode.

In an exemplary embodiment of the present invention, forming the photoelectric element includes: forming a lower electrode connected to the at least one circuit element; forming a P-Intrinsic-N (PIN) film on the lower electrode, wherein the PIN film includes an N-type semiconductor layer, an I-type semiconductor layer, and a P-type semiconductor layer, forming an upper electrode film on the PIN film; and forming a PIN layer and an upper electrode by respectively patterning the PIN film and the upper electrode film.

In an exemplary embodiment of the present invention, forming the contact hole includes forming a mask having an opening corresponding to the upper electrode disposed on the self-assembled monofilm; dry etching the substrate; wet etching the substrate; and removing the mask.

According to an exemplary embodiment of the present invention, a display device includes: a display panel including pixels; and an optical sensor disposed on the display panel and including a plurality of sensor pixels, wherein each of the plurality of sensor pixels includes: a first substrate; a first circuit element layer disposed on the first substrate and including a first circuit element configuring the plurality of sensor pixels; and a photoelectric element layer including a photoelectric element, a self-assembled monolayer, and a bias electrode connected to the photoelectric element, wherein the photoelectric element is connected to the first circuit element, and wherein the bias electrode overlaps the self-assembled monolayer.

In an exemplary embodiment of the present invention, the photoelectric element includes: a lower electrode connected to the first circuit element; a P-Intrinsic-N (PIN) layer disposed on the lower electrode; and an upper electrode disposed on the PIN layer and connected to the bias electrode.

In an exemplary embodiment of the present invention, the photoelectric element layer further includes a first protective layer covering the upper electrode, and the bias electrode is formed on the first protective layer and is connected to the upper electrode through a contact hole formed in the first protective layer.

In an exemplary embodiment of the present invention, the self-assembled monolayer is formed between the first protective layer and the bias electrode.

In an exemplary embodiment of the present invention, the display panel includes: a second substrate; a second circuit element layer disposed on the second substrate and including a second circuit element configuring the pixels; a light emitting element layer formed on the second circuit element layer and including light emitting elements forming the plurality of pixels; and a second protective layer formed on the light emitting element layer.

In an exemplary embodiment of the present invention, the display panel further includes a light blocking layer disposed between the second substrate and the second circuit element layer and including openings through which incident light passes.

DETAILED DESCRIPTION OF THE EMBODIMENTS

Figure 1:
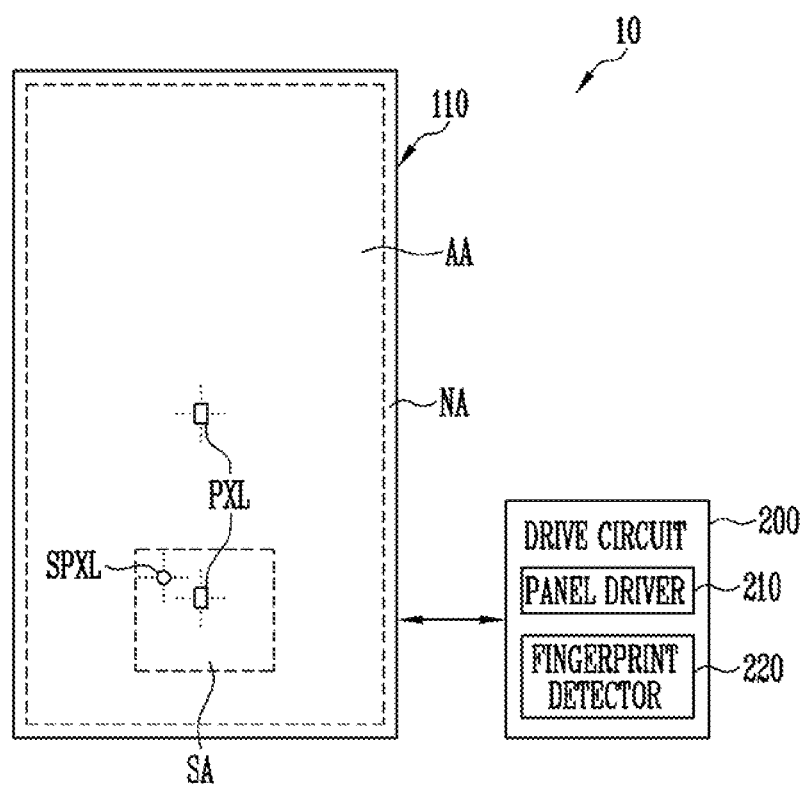
FIGS. 1 and 2 are planar views schematically illustrating display devices according to an exemplary embodiment of the present invention.

Hereinafter, exemplary embodiments of the present invention will be described in detail with reference to the accompanying drawings. The same or similar reference numerals may be used for the same configuration elements in the drawings and the present specification, and thus, repetitive descriptions may be omitted.

Figure 2:
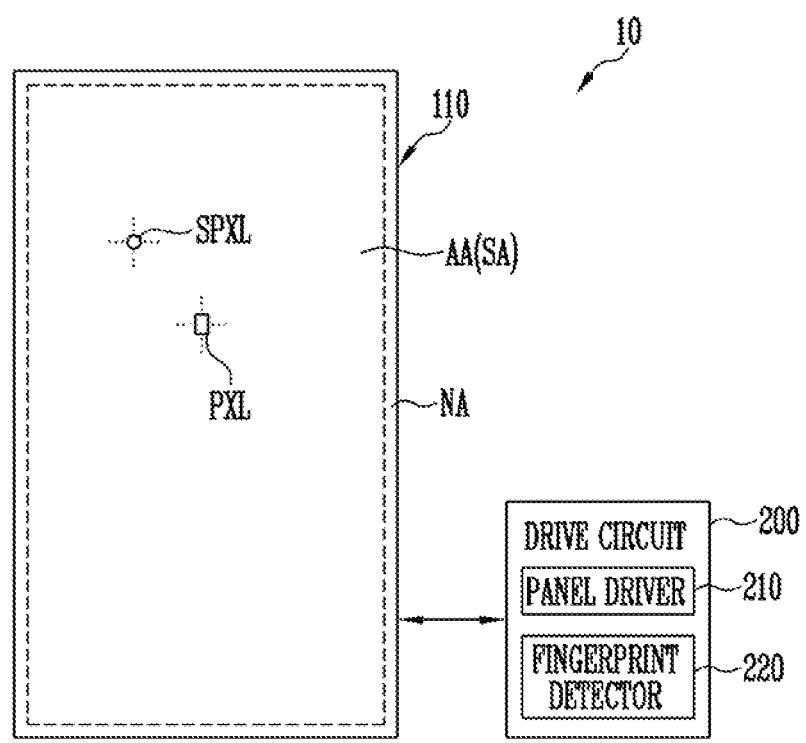

FIGS. 1 and 2 are planar views schematically illustrating display devices according to an exemplary embodiment of the present invention. For example, FIGS. 1 and 2 are diagrams schematically illustrating a display panel included in the display device according to an exemplary embodiment of the present invention and a drive circuit for driving the display panel. FIGS. 1 and 2 separately illustrate the display panel and the drive circuit for the sake of convenience, but the present invention is not limited thereto. For example, all or a part of the drive circuit may be realized integrally on the display panel.

A display device 10 may be provided in various shapes. For example, the display device 10 may be provided in a rectangular plate shape having two pairs of sides, and in each pair, the sides are parallel to each other. The display device 10 may display certain visual information, for example, a text, a video, a photograph, two-dimensional or three-dimensional images, and the like in an image display direction.

The display device 10 may have flexibility in whole or in at least a part. For example, the entire display device 10 may be flexible, or the display device 10 may be flexible in a region corresponding to a flexible region.

Referring to FIGS. 1 and 2, the display device 10 includes the display panel 110 and the drive circuit 200 for driving the display panel 110.

The display panel 110 includes a display region AA and a non-display region NA. The display region AA is a region where a plurality of pixels PXL (which may also be referred to as a sub-pixels) are provided and may be referred to as an active area. In an exemplary embodiment of the present invention, each of the pixels PXL may include at least one light emitting element. The display device 10 displays an image in the display region AA by driving the pixels PXL in response to image data input from the outside (e.g., an external device).

In an exemplary embodiment of the present invention, the display region AA may include a sensing region SA. The sensing region SA may include at least a part of the pixels PXL provided in the display region AA.

As illustrated in FIG. 1, at least a part of the display region AA may be set as the sensing region SA. In an exemplary embodiment of the present invention, as illustrated in FIG. 2, the entirety of the display region AA may be set as the sensing region SA.

In addition, FIG. 1 illustrates an example in which only one sensing region SA is formed on the display region AA, but the present invention is not limited thereto. For example, a plurality of sensing regions SA may be arranged on the display region AA. In this embodiment, the plurality of sensing regions SA may have the same area and shape or different areas and shapes.

Further, FIG. 1 illustrates an example in which the sensing region SA is formed in at least a part of the display region AA, but the present invention is not limited thereto. For example, the sensing region SA may overlap at least a part of the display region AA.

The non-display region NA is disposed around the display region AA and may be referred to as a non-active area. For example, the non-display region NA may at least partially surround the display region AA. In an exemplary embodiment of the present invention, the non-display region NA may be the remaining region of the display panel 110 except the display region AA. In an exemplary embodiment of the present invention, the non-display region NA may include a wiring region, a pad region, various dummy regions, and the like.

In an exemplary embodiment of the present invention, the display device 10 may further include a plurality of sensor pixels SPXL provided in the sensing region SA. The sensor pixels SPXL may be configured as a sensor for sensing light. In an exemplary embodiment of the present invention, when light emitted from a light source provided in the display device 10 is reflected by a finger of a user, the sensor pixels SPXL may detect the reflected light and output a corresponding electrical signal (for example, a voltage signal). The electrical signal may be transmitted to a drive circuit 200 which will be described below and used for fingerprint detection. Hereinafter, the present invention will be described by taking an example in which the sensor pixels SPXL are used for the fingerprint detection, but the sensor pixels SPXL may also be used for performing various functions such as a touch sensor or a scanner.

When the sensor pixels SPXL are arranged on the sensing region SA, the sensor pixels SPXL may overlap the pixels PXL or may be arranged around the pixels PXL. For example, a part or all of the sensor pixels SPXL may overlap the pixels PXL or may be disposed between the pixels PXL. In an exemplary embodiment of the present invention, the sensor pixels SPXL and the pixels PXL may have the same size or different sizes. However, the present invention is not limited to a size and arrangement between the sensor pixels SPLX and the pixels PXL.

When the sensor pixels SPXL are arranged adjacent to or overlap the pixels PXL in at least a part, the sensor pixels SPXL may use a light emitting element provided in the pixel PXL as a light source. In the present embodiment, the sensor pixels SPXL may form a fingerprint sensor of a light sensing method together with the light emitting devices provided in the pixels PXL. As such, when a display device having a fingerprint sensor embedded therein is configured by using the pixels PXL as a light source without a separate external light source, thicknesses of the fingerprint sensor of the optical sensor type and the display device having the same may be reduced, and manufacturing cost thereof may be reduced.

In an exemplary embodiment of the present invention, the sensor pixels SPXL may be arranged on a rear surface (for example, a back surface) facing a surface (for example, a front surface) where an image is displayed, among both surfaces of the display panel 110. However, the present invention is not limited thereto.

The drive circuit 200 may drive the display panel 110. For example, the drive circuit 200 may output a data signal corresponding to image data to the display panel 110 or may output a drive signal for the sensor pixel SPXL and may receive an electrical signal (for example, a sensing signal) from the sensor pixel SPXL. The drive circuit 200 may detect a fingerprint form of a user by using the electrical signal.

In an exemplary embodiment of the present invention, the drive circuit 200 may include a panel driver 210 and a fingerprint detector 220. For the sake of convenience, FIGS. 1 and 2 illustrate the panel driver 210 and the fingerprint detector 220 separately, but the present invention is not limited thereto. For example, at least a part of the fingerprint detector 220 may be integrated with the panel driver 210 or may operate in conjunction with the panel driver 210.

The panel driver 210 may sequentially supply the data signals corresponding to the image data to the pixels PXL while sequentially watching the pixels PXL of the display region AA. Then, the display panel 110 may display an image corresponding to the image data.

In an exemplary embodiment of the present invention, the panel driver 210 may supply a drive signal for fingerprint sensing to the pixel PXL. The drive signal may be provided to cause the pixel PXL to emit light and operate as a light source for the sensor pixel SPXL. In present embodiment, the drive signal for fingerprint sensing may be provided to the pixel PXL provided in a specific region in the display panel 110, for example, the pixel PXL provided in the sensing region SA. In an exemplary embodiment of the present invention, the drive signal for fingerprint sensing may be provided by the fingerprint detector 220.

The fingerprint detector 220 may transmits the drive signal (for example, a drive voltage) for driving the sensor pixel SPXL to the sensor pixel SPXL and may detect a user fingerprint based on an electrical signal received from the sensor pixel SPXL. The drive voltage of the sensor pixel SPXL may be, for example, about −7 to about −3 V, but the present invention is not limited thereto.

Figure 3:
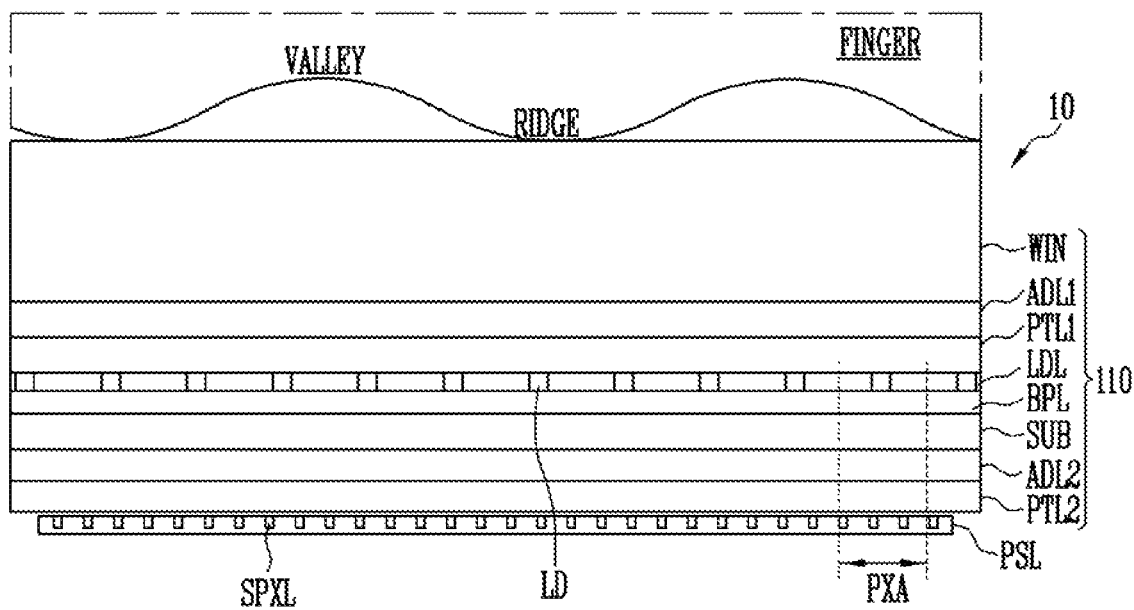
FIG. 3 is a cross-sectional view of a display device according to an exemplary embodiment of the present invention.

FIG. 3 is a cross-sectional view of the display device according to an exemplary embodiment of the present invention. For example, FIG. 3 is a cross-sectional view of the sensing region SA of the display device 10 illustrated in FIGS. 1 and 2.

Referring to FIG. 3, the display device 10 may include the display panel 110 and an optical sensor PSL disposed on one surface of the display panel 110 in the sensing region SA. Further, the display device 10 may include a substrate SUB, and a circuit element layer BPL, a light emitting element layer LDL, a first protective layer PTL1, a first adhesive layer ADL1, and a window WIN which are sequentially arranged on one surface (for example, an upper surface) of the substrate SUB. Further, the display device 10 may include a second adhesive layer ADL2 and a second protective layer PTL2 that are sequentially arranged on the other surface (for example, a lower surface) of the substrate SUB in the sensing region SA.

The substrate SUB may be a base member of the display panel 110 and may be a substantially transparent and transmissive substrate. The substrate SUB may be a rigid substrate including, for example, glass or tempered glass, or a flexible substrate formed of, for example, plastic. However, a material of the substrate SUB is not limited thereto, and the substrate SUB may be formed of various materials.

The substrate SUB may include the display region AA and the non-display region NA as illustrated in FIGS. 1 and 2. The display region AA may include a plurality of pixel areas PXA, each of which includes one pixel PXL.

The circuit element layer BPL is disposed on one surface of the substrate SUB and may include at least one conductive layer. For example, the circuit element layer BPL may include a plurality of circuit elements, various power supplies for driving the pixels PXL, and wires for supplying signals. The plurality of circuit elements may, for example, configure a pixel circuit of the pixel PXL and a sensor pixel SPXL. In this case, the circuit element layer BPL may include various circuit elements such as at least one transistor and a capacitor, and a plurality of conductive layers for forming wires connected thereto. Further, the circuit element layer BPL may include at least one insulating layer provided between the plurality of conductive layers. Further, the circuit element layer BPL may include a wiring portion which is disposed in the non-display region NA of the substrate SUB and supplies power and a signal corresponding to the wires connected to the pixels PXL The light emitting element layer LDL may be disposed on one surface of the circuit element layer BPL. The light emitting element layer LDL may include a plurality of light emitting elements LD connected to circuit elements and/or wires of the circuit element layer BPL through a contact hole or the like. In an exemplary embodiment of the present invention, at least one of the plurality of light emitting elements LID may be provided for each pixel PXL.

Each of the pixels PXL may include circuit elements disposed in the circuit element layer BPL and at least one light emitting element LD disposed in the light emitting element layer LDL disposed on the circuit element layer BPL.

The first protective layer PTL1 may be disposed on the light emitting element layer LDL to cover the display region AA. The first protective layer PTL1 may include a sealing member such as a thin film encapsulation (TFE) or an encapsulation substrate and may further include a protective film or the like in addition to the sealing member.

The first adhesive layer ADL1 couples the first protective layer PTL1 to the window WIN by being disposed therebetween. The first adhesive layer ADL1 may include a transparent adhesive such as an optical clear adhesive (OCA) and may include various adhesive materials in addition to this.

For example, the window WIN may be a protection member disposed on the top of a module of the display device 10 including the display panel 110 and may be a substantially transparent and transmissive substrate. The window WIN may have a multilayer structure including, for example, a glass substrate, a plastic film, and/or a plastic substrate. The window WIN may include a rigid or flexible substrate, and a material of the window WIN is not limited in particular.

In an exemplary embodiment of the present invention, the display device 10 may further include a polarization plate and/or a touch sensor layer (e.g., a touch electrode layer). For example, the display device 10 may further include the polarization plate and/or the touch sensor layer disposed between the first protective layer PTL1 and the window WIN.

The second protective layer PTL2 may be disposed on the other surface of the substrate SUB. The second protective layer PTL2 may be bonded to the substrate SUB by the second adhesive layer ADL2.

The second adhesive layer ADL2 may firmly bond (or attach) the substrate SUB to the second protective layer PTL2. The second adhesive layer ADL2 may include a transparent adhesive such as OCA. For example, the second adhesive layer ADL2 may include a pressure sensitive adhesive (PSA) in which an adhesive material acts when a pressure for bonding the second adhesive layer ADL2 to an adhesive surface is applied. When the second adhesive layer ADL2 includes the pressure sensitive adhesive, the second adhesive layer ADL2 may be attached to the substrate SUB and the second protective layer PTL2 by pressure alone without a separate heat treatment or UV treatment at a room temperature.

The second protective layer PTL2 may block inflow of oxygen and moisture from the outside and may be provided in a form of a single layer or a multilayer. The second protective layer PTL2 may be formed in a film form to further secure flexibility of the display panel 110. The second protective layer PTL2 may be coupled with the optical sensor PSL through another adhesive layer including a transparent adhesive such as OCA.

In an exemplary embodiment of the present inventive concept, a selective light blocking film may be further provided below the second protective layer PTL2. The selective light blocking film may block a predetermined frequency region, for example, infrared rays, from external light introduced into the display device 10, thereby, preventing the light from being incident on the sensor pixels SPXL of the optical sensor PSL. In the above description, the selective light blocking film may be provided under the second protective layer PTL2, but the present inventive concept is not limited thereto. For example, in an exemplary embodiment of the present inventive concept, the selective light blocking film may be provided on any layer of the display device 10 and on an upper portion of the optical sensor PSL. Further, the selective light blocking film may be omitted when a configuration element that blocks infrared rays is included in the display panel 110.

The optical sensor PSL is attached to a rear surface (for example, a back surface) of the display panel 110 through an adhesive or the like to overlap at least one region of the display panel 110. For example, the optical sensor PSL may be disposed to overlap the display panel 110 in the sensing region SA. The optical sensor PSL may include a plurality of sensor pixels SPXL distributed at predetermined resolutions and/or intervals.

The sensor pixels SPXL may have a predetermined number, size, and arrangement such that an identifiable fingerprint image can be generated from electrical signals output by the sensor pixels SPXL. A distance between the sensor pixels SPXL may be densely set such that reflection light reflected from an observation target (for example, a fingerprint or the like) is incident on at least two neighboring sensor pixels SPXL.

The sensor pixels SPXL may sense external light and output a corresponding electrical signal, for example, a voltage signal. The reflection light received by each of the sensor pixels SPXL may have different optical characteristics (for example, frequency, wavelength, size, and the like) depending on valleys and ridges formed on a fingerprint of a user's finger. Therefore, each of the sensor pixels SPXL may output a voltage signal having different electrical characteristics in response to the optical characteristics of the reflection light. The voltage signals output by the sensor pixels SPXL may be converted into image data by the fingerprint detector 220 and used to identify the fingerprint of the user.

As described above, the display device 10 according to an exemplary embodiment of the present invention includes the light emitting element layer LDL and a fingerprint sensor including the optical sensor PSL. The light emitting element layer LDL may include light emitting elements LD that may also function as a light source of a photosensitive sensor. The optical sensor PSL may include the sensor pixels SPXL that receive the reflection light emitted from the light emitting element layer LDL and reflected from an object (for example, a fingerprint region of a finger) located above the display device 10.

In addition, although the display device 10 also utilizes the light emitting elements LD of the pixels PXL as a light source of the fingerprint sensor, the present invention is not limited thereto. For example, a display device according to an exemplary embodiment of the present invention may include a separate light source for fingerprint detection.

A fingerprint detection method of the display device 10 according to an exemplary embodiment of the present invention will be described as follows. During a fingerprint detection period in which the sensor pixels SPXLs are activated, the pixels PXL in the display region AA (for example, the light emitting elements LD provided in the pixels PXL) may emit light in a region of the display region AA where a finger (for example, a fingerprint region) of a user is in contact with or in proximity to the display region AA. For example, all the pixels PXL in the display region AA may emit light simultaneously or sequentially during the fingerprint detection period. In addition, only some pixels PXL may emit light at predetermined intervals among the pixels PXL in the display region AA, or only some pixels PXL may emit light of a predetermined color (for example, light having a short wavelength such as blue light) can selectively emit light. In addition, the sensor pixels SPXL may be driven simultaneously or sequentially during the fingerprint detection period.

Some of the light emitted from the pixels PXL may be reflected by the finger of a user and be incident on the sensor pixels SPXL. At this time, a fingerprint form (or, e.g., fingerprint pattern) of the user may be detected based on a difference in the amount of light and/or a waveform of the reflection light reflected from a ridge and a valley of the fingerprint.

Figure 4:
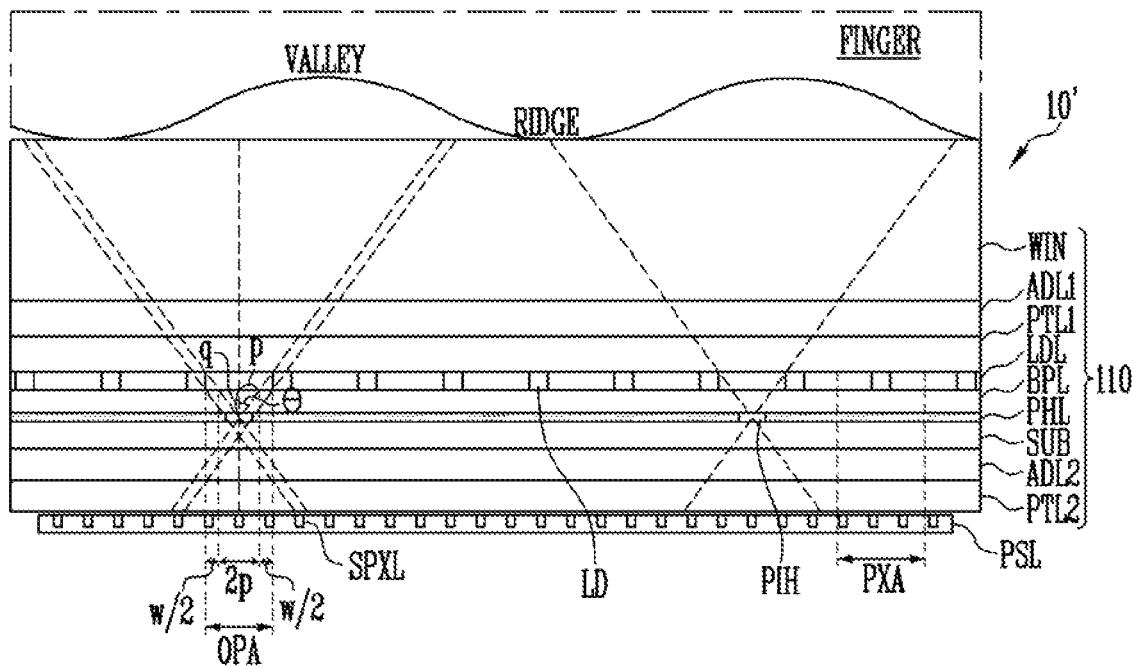
FIG. 4 is a cross-sectional view of a display device according to an exemplary embodiment of the present invention.

FIG. 4 is a cross-sectional view of a display device according to an exemplary embodiment of the present invention.

Referring to FIG. 4, in an exemplary embodiment of the present invention, a display device 10' may further include a light blocking layer PHL. The light blocking layer PHL may be disposed inside the display panel 110 or between the display panel 110 and the sensor circuits SPXL to block a part of light that would be incident on the sensor circuits SPXL. For example, the light blocking layer PHL may selectively block and transmit the light (hereinafter, referred to as reflection light) reflected from an object coming into or already in contact with an upper end of the display panel 110, for example, a finger. Some of the light incident on the light blocking layer PHL may be blocked, and some of the remaining light may pass through pinholes PIH to reach the sensor circuits SPXL under the light blocking layer PHL.

The light blocking layer PHL includes a plurality of pinholes PIH. The pinhole PIH may be an optical hole and may be a kind of light-transmitting hole. For example, the pinhole PIH may be a light-transmitting hole having a relatively small size (e.g., area). For example, the pinhole PIH may have the smallest size of the light-transmitting holes in layers of the display device 10 that overlap each other. For example, the pinhole PIH may be on a path through which the reflection light passes through the display panel 110 in an oblique or vertical direction and is incident on the sensor pixel SPXL.

The display panel 110 may be transparently formed in a region where the pinholes PIH are arranged such that the reflection light reflected by a fingerprint of a finger and the like may pass through the respective pinholes PIH. Further, to reduce loss of the reflection light required for fingerprint detection, the display panel 110 may be configured such that light satisfying an observation field of view (FOV) (or, e.g., referred to as a viewing angle) of a predetermined angle range may be transmitted through each pinhole PIH.

For example, the display panel 110 may be transparent and formed in a region overlapping the pinhole PIH while having a larger area than the corresponding pinhole PIH with respect to a region where the respective pinholes PIH are arranged. Hereinafter, a region formed transparently such that the reflection light can transmit is referred to as an "optical opening region".

When the observation viewing angle of a desirable range is referred to as 0, a thickness of the circuit element layer BPL is referred to as q, and a width of an optical opening region OPA formed at an interface between the circuit element layer BPL and the light emitting element layer LDL is referred to as 2p on the basis of the center of each pinhole PIH, $2p=2\times(q\times\tan\theta)$ may be established. In an exemplary embodiment of the present invention, the observation field of view may be an angle in a range of approximately 30 to 60 degrees, for example 45 degrees, and the present invention is not limited thereto.

The pinholes PIH may have a predetermined width w, for example, the width w in a range of about 5 μm to about 20 m, and a width of the optical opening region OPA considering the width w of the pinholes PIH may be 2p+w. In this manner, as being distant from the light blocking layer PHL (for example, as going toward the upper and lower portions of the light blocking layer PHL, respectively), the width of the optical opening region OPA to be secured in each layer of the display device 10 may be gradually increased.

The width w (or, e.g., diameter) of the pinhole PIH may be set to approximately 10 times or more of a wavelength of the reflection light, for example, approximately 4 μm or approximately 5 μm or more so to prevent diffraction of light. Further, the width w of the pinhole PIH may be set to a size sufficient to prevent image blur and more clearly detect a shape of a fingerprint. For example, the width w of the pinhole PIH may be set to approximately 15 μm or less. However, the present invention is not limited thereto, and the width w of the pinhole PIH may be changed depending on a wavelength bandwidth of the reflection light and/or a layer thickness of a module.

An interval (or, e.g., pitch) between the adjacent pinholes PIH may be set in consideration of a distance between the light blocking layer PHL and the optical sensor PSL and a wavelength range of the reflection light. For example, when the observation field of view of the reflection light to be secured is approximately 45 degrees, the distance between the adjacent pinholes PIH may be set to be more than twice the distance between the light blocking layer PHL and the optical sensor PSL and may be set to be equal to or larger than the sum of the distance and a predetermined error range. In this case, it is possible to prevent the images observed by the respective sensor pixels SPXL from overlapping each other, and thereby, image blur may be prevented.

Only the reflection light passing through the pinhole PIH may reach the sensor pixel SPXL of the optical sensor PSL. The sensor pixel SPXL may output an electrical signal corresponding to the received reflection light, for example, a voltage signal.

As described above, the display device 10' according to an exemplary embodiment of the present invention includes a fingerprint sensor including the light emitting element layer LDL, the optical sensor PSL, and the light blocking layer PHL. The light emitting element layer LDL may include the light emitting elements LD that may also function as a light source of a photosensitive sensor. At least one of the light emitting elements LD may be disposed in each pixel region PXA. The optical sensor PSL may include the sensor pixel SPXL that receives the reflection light emitted from the light emitting element layer LDL and reflected from an object (for example, a fingerprint region of a finger) located above the display device 10. The light blocking layer PHL may include the pinhole PIH disposed between the light emitting element layer LDL and the optical sensor PSL to selectively transmit the reflection light.

Figure 5:
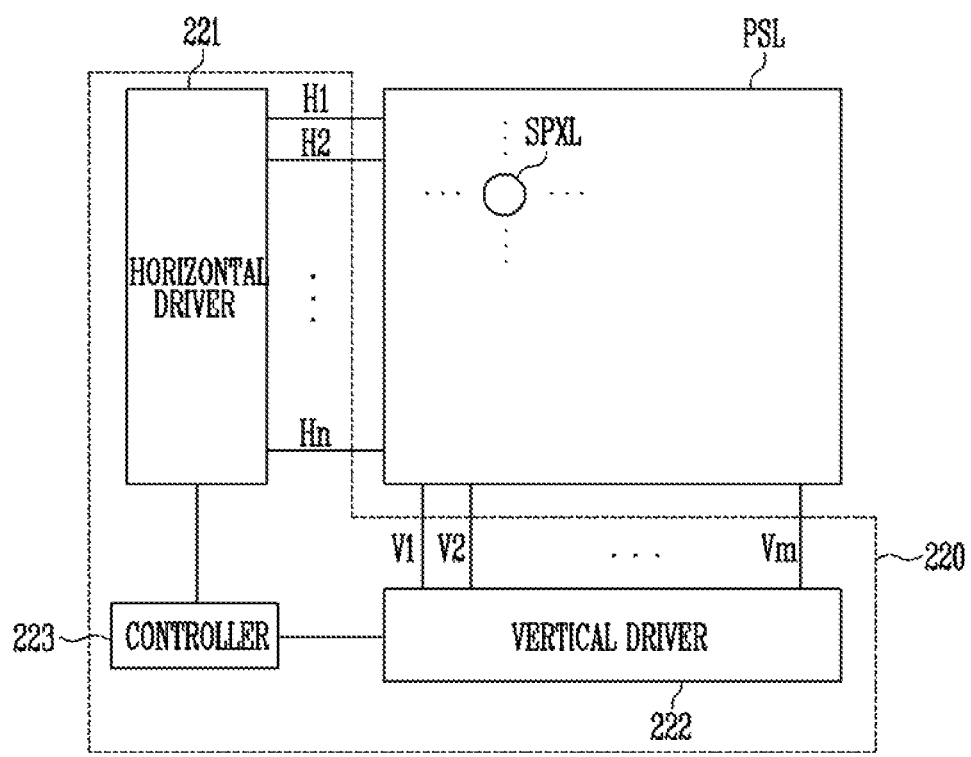
FIG. 5 is a planar view illustrating a configuration of an optical sensor and a fingerprint detector according to an exemplary embodiment of the present invention.

FIG. 5 is a planar view illustrating a configuration of the optical sensor and a fingerprint detector according to an exemplary embodiment of the present invention.

Referring to FIG. 5, the optical sensor PSL may include an array of the sensor pixels SPXL. In an exemplary embodiment of the present invention, the sensor pixels SPXL may be arranged in a two-dimensional array and is not limited thereto. Each sensor pixel SPXL may include a photoelectric element that photoelectrically converts incident light into electric charges according to the amount of received light. A specific structure of the sensor pixel SPXL will be described in detail with reference to FIG. 6 below.

The fingerprint detector 220 may include a horizontal driver 221, a vertical driver 222, and a controller 223.

The horizontal driver 221 may be connected to the sensor pixels SPXL through the drive lines H1 to Hn. The horizontal driver 221 may be configured with a shift register or an address decoder. In an exemplary embodiment of the present invention, the horizontal driver 221 may apply a drive signal to drive the selected sensor pixel SPXL among the sensor pixels SPXL. For example, the horizontal driver 221 may apply the drive signal in unit of a sensor pixel row. The horizontal driver 221 may include a reset unit for resetting unnecessary charges stored in the sensor pixel SPXL.

The sensor pixel SPXL selected and driven by the horizontal driver 221 senses light using a photoelectric element provided in the sensor pixel SPXL, and outputs an electrical signal corresponding to the detected light, for example, a voltage signal. The electrical signal output in this way may be, for example, an analog signal.

The vertical driver 222 may be connected to the sensor pixels SPXL through signal lines V1 to Vm. The vertical driver 222 may process a signal output from the sensor pixel SPXL.

The vertical driver 222 may perform, for example, a correlated double sampling (CDS) process for removing noise from the received electrical signal. Further, the vertical driver 222 may convert an analog signal received from the sensor pixel SPXL into a digital signal. In an exemplary embodiment of the present invention, the analog-to-digital converter of the vertical driver 222 may be provided for each sensor pixel column and may process in parallel analog signals received from a sensor pixel column.

The vertical driver 222 may be further configured by a shift register or an address decoder. The vertical driver 222 may select a processing circuit corresponding to the sensor pixel string, for example, an analog-to-digital converter in regular sequence. The electrical signal processed by a processing circuit selected by the vertical driver 222, for example, a digital signal may be output.

The controller 223 may be configured by a timing generator and the like that generate various timing signals and may control the horizontal driver 221 and the vertical driver 222 based on the timing signals generated by the corresponding timing generator.

In an exemplary embodiment of the present invention, the controller 223 may generate image data from a signal received from the vertical driver 222, for example, an electrical signal, and the controller 223 may process the generated image data. Further, in an exemplary embodiment of the present invention, the controller 223 may detect a fingerprint from the processed image data, or perform authorization and/or external transmission of the detected fingerprint. However, generation of image data, and fingerprint detection may not be performed by the controller 223 but may be performed by an external host processor or the like. In the present embodiment, the controller 223 may transmit an electrical signal received from the vertical driver 222, for example, a digital signal, to an external host processor or the like may transmit via the panel driver 210 or the like. For example, the controller 223 may directly transmit the electrical signal received from the vertical driver 222 to the external host processor.

Figure 6:
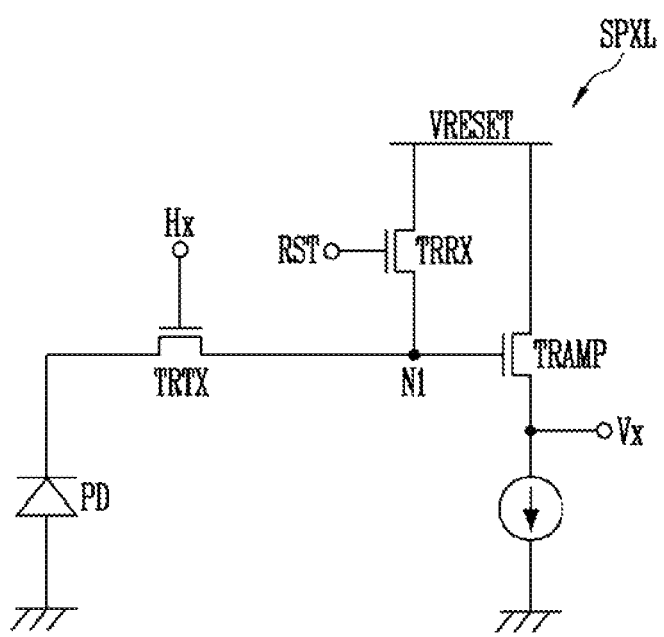
FIG. 6 is a circuit diagram illustrating a sensor pixel illustrated in FIG. 5.

FIG. 6 is a circuit diagram illustrating the sensor pixel illustrated in FIG. 5 according to an exemplary embodiment of the present invention. FIG. 6 illustrates the sensor pixel SPXL disposed in an x-th sensor pixel row and an x-th sensor pixel column as the sensor pixel SPXL having a three-transistor structure.

Referring to FIG. 6, the sensor pixel SPXL is an example of a photoelectric element and includes a photodiode PD, a transfer transistor TRTX, a reset transistor TRRX, and an amplification transistor TRAMP. FIG. 6 illustrates an example in which transistors are N-type transistors; however, in an exemplary embodiment of the present invention, at least some of the transistors may be P-type, and a circuit structure of the sensor pixel SPXL may be modified according to that.

An anode electrode of the photodiode PD is grounded. The transfer transistor TRTX is connected between a cathode electrode of the photodiode PD and a first node N1, and a gate electrode thereof is connected to the horizontal driver 221. The transfer transistor TRTX is turned on when a drive signal is applied by a drive line Hx, and operates as a transfer gate unit that transfers charges photoelectrically converted by the photodiode PD to the first node N1 which is a charge voltage converter.

A reset transistor TRRX is connected between a reset power supply VRESET and the first node N1 and may receive a reset signal through the gate electrode. When the reset signal is applied, the reset transistor TRRX may be turned on and set a voltage of the first node N1 to a voltage of the reset power supply VRESET. In addition, the reset signal may be applied by a reset line RST connected to the gate electrode of the reset transistor TRRX The amplification transistor TRAMP is connected between the reset power supply VRESET and a signal line Vx, and the gate electrode is connected to the first node N1. The amplification transistor TRAMP operates as an amplifier that outputs a signal corresponding to a voltage of the first node N1 to the signal line Vx.

In an exemplary embodiment of the present invention, the structure of the sensor pixel SPXL is not limited to the above description, and the sensor pixel SPXL may be modified to include, for example, a four-transistor structure and the like.

Figure 7:
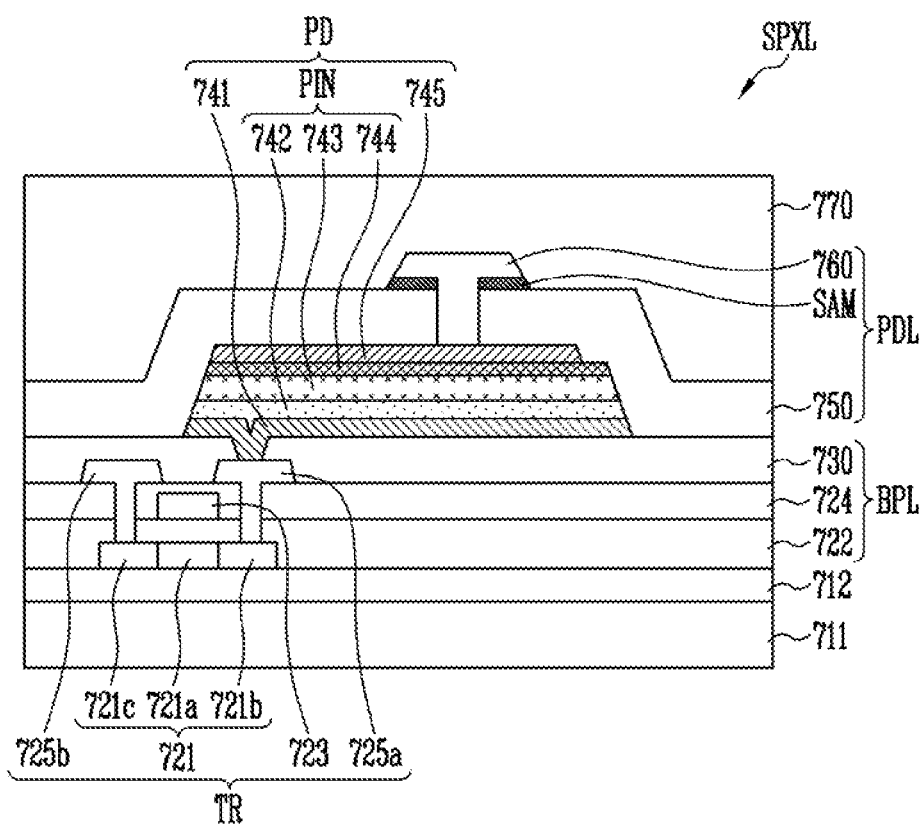
FIG. 7 is a side cross-sectional view of the sensor pixel illustrated in FIG. 6.

FIG. 7 is a side cross-sectional view of the sensor pixel illustrated in FIG. 6 according to an exemplary embodiment of the present invention. For example, FIG. 7 illustrates a side cross-sectional view of one transistor TR (for example, the transfer transistor TRTX) and the photodiode PD included in the sensor pixel SPXL.

Referring to FIG. 7, the sensor pixel SPXL may include a buffer layer 712, the circuit element layer BPL, the photoelectric element layer PDL, and a planarization layer 770 which are sequentially stacked on a surface of a substrate 711, for example, an upper surface of the substrate 711.

For example, the substrate 711 may be a base member of the optical sensor PSL, and may be a rigid substrate including, for example, glass or tempered glass, or a flexible substrate formed of, for example, a plastic material. However, the material of the substrate 711 is not limited thereto, and the substrate 711 may be formed of various materials.

The buffer layer 712 may be disposed on the substrate 711. The buffer layer 712 may be formed of a single layer or a multilayer of a silicon oxide film (SiOx) and/or a silicon nitride film (SiNx).

The transistor TR may be disposed on the buffer layer 712. The transistor TR may be one of an oxide thin film transistor (TFT) formed of a material based on an indium gallium zinc oxide (IGZO), a low temperature polycrystalline silicon (LTPS), and/or an amorphous silicon thin film transistor (a-Si TFT). The transistor TR may have, for example, the following structure.

An active pattern 721 may be provided on the buffer layer 712. The active pattern 721 may include a channel region 721a through which electrons move, and a source region 721b and a drain region 721c which are formed at one side and the other side of the channel region 721a, respectively. For example, the source region 721b and the drain region 721c are respectively formed at opposing sides of the channel region 721a.

A gate insulating layer 722 may be disposed on the active pattern 721. The gate insulating layer 722 may include one or more inorganic layers and/or organic layers. The gate insulating layer 722 may be formed of a single layer or a multilayer of a silicon oxide film (SiOx) and/or a silicon nitride film (SiNx). A material forming the gate insulating layer 722 is not limited to the above, and the gate insulating layer 722 may include, for example, an inorganic insulating material or an organic insulating material such as SiOx, SiNx, SiON, SiOF, AlOx, or the like. The gate insulating layer 722 may insulate the active pattern 721 from a gate electrode 723 which will be described below The gate electrode 723 is disposed on the gate insulating layer 722. The gate electrode 723 may be disposed to correspond to the channel region 721a of the active pattern 721. For example, the gate electrode 723 may overlap the channel region 721a. For example, when the transistor TR is the transfer transistor TRTX, the gate electrode 723 may be electrically connected to a drive line Hx. For example, the drive line Hx may be provided on the same layer as the gate electrode 723, and the gate electrode 723 may extend from the drive line Hx.

The gate electrode 723 may be a single layer or a multilayer formed of a conductive material. The gate electrode 723 may be formed of, for example, Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, Pb, and/or the like. The gate electrode 723 may be formed of an alloy of, for example, MoTi and AlNiLa. The gate electrode 723 may be a multilayer formed of, for example, Ti/Cu, Ti/Au, Mo/Al Mo, ITO/Ag/ITO, TiN/Ti/A/Ti, TiN/Ti/Cu/Ti, and/or the like.

An interlayer insulating layer 724 may be disposed on the gate electrode 723. The interlayer insulating layer 724 may include one or more inorganic films and/or organic films. For example, the interlayer insulating layer 724 may be formed of a single layer or a multilayer of a silicon oxide film (SiOx) and/or a silicon nitride film (SiNx).

Contact holes may be formed in the interlayer insulating layer 724 to connect a source electrode 725a and a drain electrode 725b to the source region 721b and the drain region 721c of the active pattern 721, respectively.

A source electrode 725a and a drain electrode 725b formed of a conductive material may be disposed on the interlayer insulating layer 724. The source electrode 725a and the drain electrode 725b may be electrically connected to the source region 721b and the drain region 721c of the active pattern 721, respectively, through the contact holes of the interlayer insulating layer 724.

A first protective layer 730 is disposed on the source electrode 725a and the drain electrode 725b. The first protective layer 730 may be formed of a single layer or a multilayer of a silicon oxide film (SiOx) and/or a silicon nitride film (SiNx).

A lower electrode 741 of the photoelectric element PD is disposed on the first protective layer 730. The lower electrode 741 may be connected to the source electrode 725a of the transistor TR through a contact hole provided in the first protective layer 730.

The lower electrode 741 may be formed of an opaque metal such as molybdenum (Mo) or a transparent oxide such as indium tin oxide (ITO), indium zinc oxide (IZO), or zinc oxide (ZnO) depending on characteristics of the photoelectric element PD.

In an exemplary embodiment of the present invention, the photoelectric element PD may be configured as a PIN diode. In the present embodiment, a pin layer PIN is disposed on the lower electrode 741, and the pin layer PIN includes an N (Negative) type semiconductor layer 742 including N type impurities, an I(Intrinsic)-type semiconductor layer 743 including no impurities, and a P (positive) type semiconductor layer 744 including P-type impurities stacked.

The I-type semiconductor layer 743 may be formed to be relatively thicker than the N-type semiconductor layer 742 and the P-type semiconductor layer 744. The pin layer PIN may be formed to include a material capable of converting light incident from the outside into an electrical signal and include, for example, materials such as a-Se, HgI2, CdTe, PbO, PbI2, BiI3, GaAs, and Ge.

An upper electrode 745 is disposed on the pin layer PIN. The upper electrode 745 may be formed of a transparent conductive material such as indium tin oxide (ITO), indium zinc oxide (IZO), and/or zinc oxide (ZnO) depending on characteristics of the photoelectric element PD.

The upper electrode 745 is disposed on the pin layer PIN and may have an area smaller than that of pin layer PIN such that a portion of the PIN layer is exposed. For example, an end portion of the upper electrode 745 disposed on the pin layer PIN may be formed on an inner surface of the pin layer PIN with an area smaller than the pin layer PIN to not coincide with an end portion of the pin layer PIN. For example, the upper electrode 745 may be disposed to have an inset structure in which an edge portion of the pin layer PIN is exposed. For example, the upper electrode 745 may have an indent or recess such that the edge portion of the pin layer PIN is exposed. As such, by arranging the upper electrode 745 on the pin layer PIN in the inset structure, it is possible to reduce a leakage current of the photoelectric element PD.

A second protective layer 750 is disposed on the upper electrode 745. The second protective layer 750 may be formed over the substrate 711. For example, the second protective layer 750 may be formed over an entire surface of the substrate 711. The second protective layer 750 may be formed of a single layer or a multilayer of a silicon oxide film (SiOx) and/or a silicon nitride film (SiNx).

As described above, the photoelectric element PD configured by the PIN diode may detect external light, convert the light into an electrical signal, and output the electrical signal. For example, if light of a specific region (for example, a visible region) is incident on the pin layer PIN, the I-type semiconductor layer 743 is depleted by the P-type semiconductor layer 744 and the N-type semiconductor layer 742, and thereby, an electric field is generated inside the I-type semiconductor layer 743. Holes and electrons generated by the light are drifted by the electric field and collected in the P-type semiconductor layer 744 and the N-type semiconductor layer 742.

A bias electrode 760 may be formed on the second protective layer 750. The bias electrode 760 may be electrically connected to the upper electrode 745 of the photoelectric element PD through a contact hole formed in the second protective layer 750. The bias electrode 760 may be grounded or connected to a certain voltage depending on a circuit structure of the sensor pixel SPXL illustrated in FIG. 6.

In an exemplary embodiment of the present invention, a self-assembled monolayer SAM may be formed between the second protective layer 750 and the bias electrode 760. For example, self-assembled monolayer SAM may extend beyond side surfaces of the bias electrode 760 and may include a hole such that the bias electrode 760 may be electrically connected to the upper electrode 745. The self-assembled monolayer SAM may include a head group chemically bonded to a surface of the second protective layer 750 or the like and a hydrophobic end portion including a carbon chain connected to the head group.

For example, the self-assembled monolayer SAM may be formed by using at least one of trichloroalkylsilane, dichlorodialkylsilane, chlorotrialkylsilane, trichloro(1H,1H,2H,2H-perfluorooctyl)silane, hexamethyldisiloxane, alkylsiloxane, alkannethiol, alkanephosphonic acid, alkanetrichlorosilane, and/or alkanetrialkoxysilane.

For example, the self-assembled monolayer SAM may be formed of a transparent material that makes light pass through. The transparent material may be a head group including, for example, ethoxysilane, methoxysilane and the like, and a silicone compound including a hydrophobic end portion containing a carbon chain linked to the head group.

The self-assembled monolayer SAM may be formed by using a coating method, a printing method, a deposition method, or the like. For example, the self-assembled monolayer SAM may be formed as a compound that self-aligns on the second protective layer 750 when a compound having a functional group capable of performing a bond, such as a covalent bond, a hydrogen bond, or a chemical adsorption, is deposited on the second protective layer 750 through chemical vapor deposition (CVD) or the like.

As described above, the end portion of the self-assembled monolayer SAM may have hydrophobicity. Accordingly, the self-assembled monolayer SAM does not react with moisture and has robustness against wet etching. In addition, the head group of the self-assembled monolayer SAM may be easily separated from the second protective layer 750 or the like through oxygen plasma treatment or the like.

A planarization layer 770 may be disposed on the bias electrode 760. The planarization layer 770 may have a substantially flat upper surface and may serve to increase surface flatness of the optical sensor PSL. The planarization layer 770 may include an organic material or an inorganic material. For example, the planarization layer 770 may be an organic material, and the planarization layer 770 may be formed of a photoresist, a polyacrylic resin, a polyimide resin, a polyamide resin, a siloxane resin, an acrylic resin, an epoxy resin, or the like.

Hereinafter, a method of manufacturing the sensor pixel SPXL according to an exemplary embodiment of the present invention illustrated in FIG. 7 will be described in detail.

FIGS. 8 to 15 are diagrams illustrating the method of manufacturing the sensor pixel. For example, FIGS. 8 to 15 illustrate a process of forming the photoelectric element layer PDL in the sensor pixel SPXL.

The method of forming each layer which will be described below may use photolithography processes including deposition, photoresist coating (PR coating), exposure, development, etch, and photoresist stripping (PR Strip) which are generally known. For example, in a case of the deposition, a method such as sputtering may be applied in a case of a metal material, and a method such as plasma enhanced vapor deposition (PECVD) may be applied in a case of a semiconductor or an insulating film. Further, in a case of the etching, dry etching or wet etching may be used selectively depending on the material.

Figure 8:
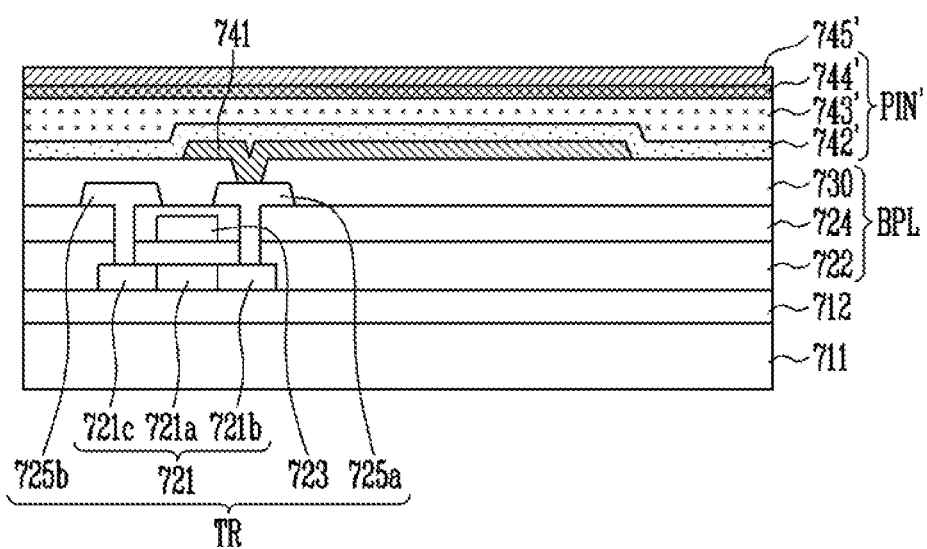
FIGS. 8, 9, 10, 11, 12, 13, 14 and 15 are diagrams illustrating a method of manufacturing the sensor pixel according to an exemplary embodiment of the present invention.

First, as illustrated in FIG. 8, the buffer layer 712 and the circuit element layer BPL are formed on the substrate 711. The buffer layer 712 may be selectively formed as needed, and the buffer layer 712 may not be formed. The active pattern 721, the gate insulating layer 722, the gate electrode 723, the interlayer insulating layer 724, the source electrode 725a, and the drain electrode 725b may be sequentially stacked on the buffer layer 712.

The first protective layer 730 may be formed on an upper portion of the circuit element layer BPL. The first protective layer 730 may be formed to cover the substrate 711 on which the circuit element layer BPL is formed. For example, the first protective layer 730 may cover the entire surface (e.g., the upper surface) of the substrate 711. A contact hole overlapping the source electrode 725a may be formed in the first protective layer 730. For example, the first protective layer 730 may be formed by coating an upper portion of the circuit element layer BPL with a curing material for forming the first protective layer 730, and by placing a mask having an opening on the curing material. In addition, the first protective layer 730 may be formed by irradiating the curing material exposed by the opening with ultraviolet light to cure the curing material, and by removing the remaining curing material except the cured curing material. Coating of the curing material may be performed, for example, by using a jetting method, but the present invention is not limited thereto. The method of forming the first protective layer 730 is not limited to the above description.

The lower electrode 741 of the photoelectric element PD connected to the source electrode 725a through a contact hole of the first protective layer 730 is formed on the first protective layer 730. Further, a pin film PIN', which includes an N-type semiconductor film 742', an I-type semiconductor film 743', and a P-type semiconductor film 744', and an upper electrode film 745' are sequentially stacked to cover the substrate 711 and the lower electrode 741. For example, the pin film PIN' and the upper electrode film 745' may cover the entire surface of the substrate 711.

Figure 9:
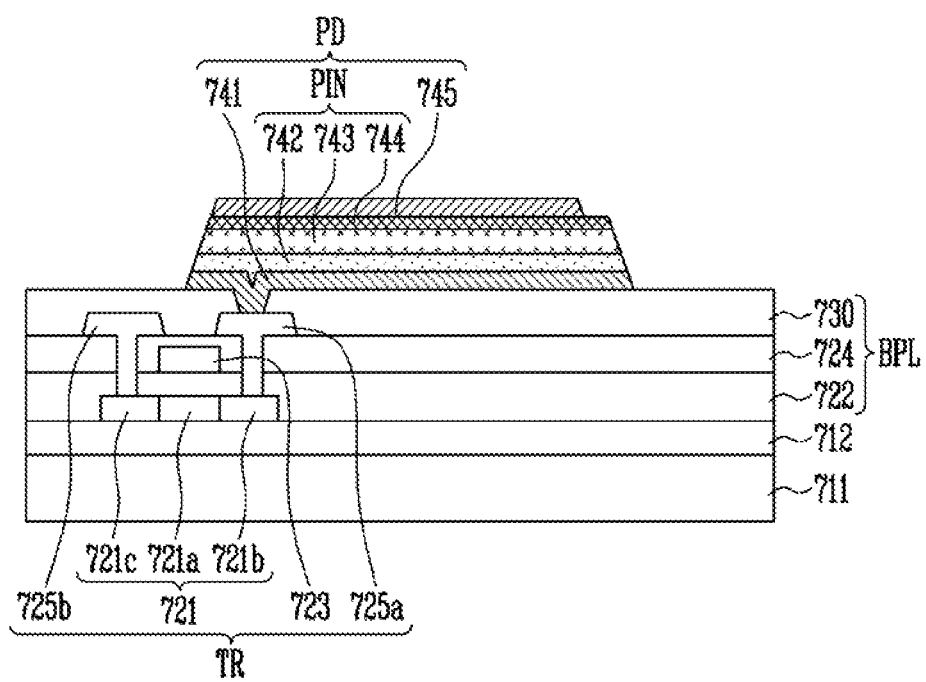

Next, as illustrated in FIG. 9, an upper electrode film 745' may be patterned through a mask process to form the upper electrode 745, and the pin film PIN' may be patterned to form the pin layer PIN. In an exemplary embodiment of the present invention, the patterning may be performed by using a wet etching method using an etchant.

In an exemplary embodiment of the present invention, an end portion of the upper electrode 745 and an end portion of the pin layer PIN do not coincide with each other, and the upper electrode 745 may be patterned to have a smaller area than the pin layer PIN. As such, if the upper electrode 745 is formed in an inner layer of the pin layer PIN to form an inset structure in which an edge of the pin layer PIN is exposed, a leakage current of the photoelectric element PD may be minimized. For example, from a cross-sectional view, the upper electrode 745 may have a shorter length than that of the pin layer PIN.

The patterned pin layer PIN may form a PIN diode type photoelectric element PD together with the lower electrode 741 and the upper electrode 745.

Figure 10:
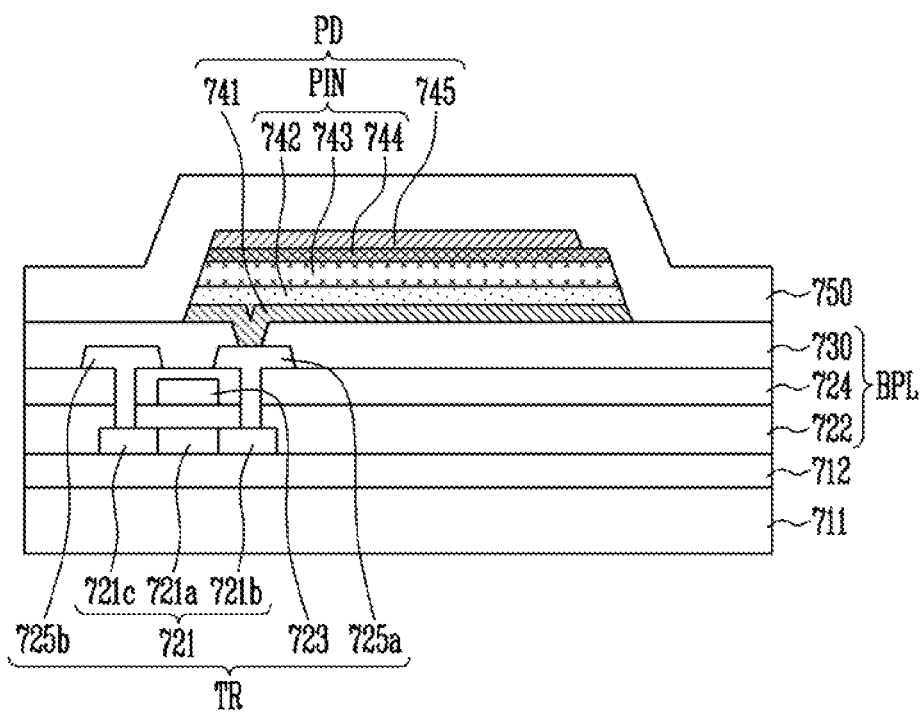

Next, as illustrated in FIG. 10, the second protective layer 750 is formed on the upper electrode 745 of the photoelectric element PD. A method of forming the second protective layer 750 may be substantially the same as the method of forming the first protective layer 730. Accordingly, a detailed description thereof will be omitted.

Figure 11:
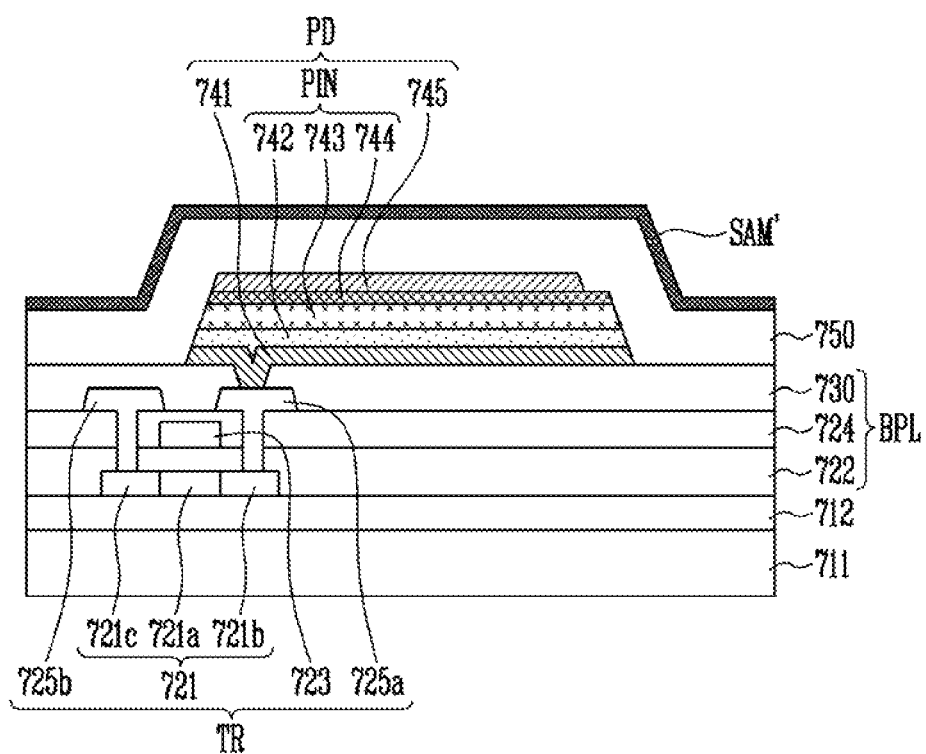

Next, as illustrated in FIG. 11, a self-assembled monofilm SAM' is formed on the second protective layer 750. The self-assembled monofilm SAM' may be formed as a compound that self-aligns on the second protective layer 750. The self-assembled monofilm SAM' may be formed as a compound that self-aligns on the second protective layer 750 when a compound having a functional group (for example, a head group) capable of interacting with a surface of the second protective layer 750 and performing a bond with the surface of the second protective layer 750, such as a covalent bond, a hydrogen bond, and a chemical adsorption, is provided to the second protective layer 750.

The self-assembled monofilim SAM' may be provided on the second protective layer 750 in a liquid phase or a gaseous phase. For example, the self-assembled monofilm SAM' may be provided on the second protective layer 750 by coating an upper portion of the second protective layer 750 with a solution containing a self-assembled compound. The compound containing solution may include water as, for example, a catalyst.

In addition, the self-assembled monofilm SAM' may be formed on the second protective layer 750 by putting the substrate 711 on which the second protective layer 750 is formed into a low pressure (for example, about 500 Pa or less) vacuum chamber together with the self-assembly compound. Here, after letting out air in the vacuum chamber, water vapor may be injected as a catalyst such that the compound may be self-assembled on the second protective layer 750. Water vapor may be injected in the amount such that a pressure in the chamber is maintained at approximately 500 Pa.

Figure 12:
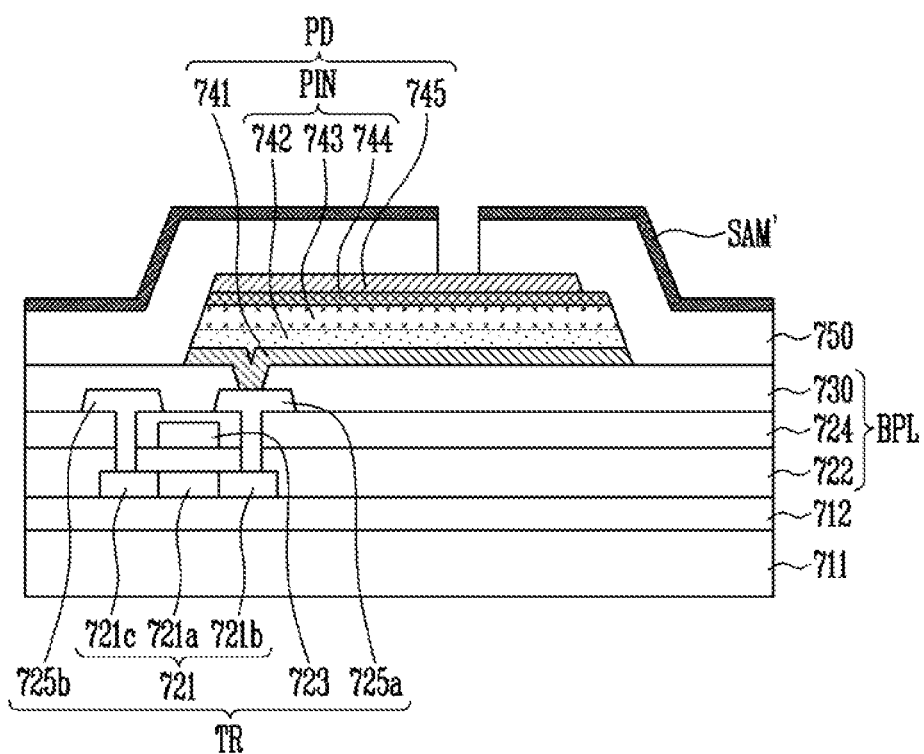

Next, as illustrated in FIG. 12, a contact hole is formed in the self-assembled monofilm SAM' and the second protective layer 750 such that a portion of the upper electrode 745 is exposed. To form the contact hole, a process of patterning the self-assembled monofilm SAM' and a process of patterning the second protective layer 750 may be sequentially performed.

For example, a mask (for example, a photoresist mask) having an opening in the region corresponding to the upper electrode 745 may be formed on the self-assembled monofilm SAM'. Thereafter, a first etching process of etching the self-assembled monofilm SAM' and a second etching process of etching the second protective layer 750 may be performed. The first etching process may be implemented by performing dry etching of, for example, an oxygen plasma process or the like. The second etching process may be implemented by performing, for example, wet etching. Thereafter, the mask may be removed from the self-assembled monolayer SAM through a strip process or the like. However, the process of generating the contact hole is not limited to the above.

After the contact hole is generated, the substrate 711 may be cleaned. The substrate 711 may be cleaned with a cleaning liquid such as deionized water or pure water. For example, buffered oxide etchant (BOE) may be used as the cleaning liquid. A mask residue, other impurities, and the like on the upper electrode 745 exposed by the contact hole may be removed by the cleaning. Further, an unevenly etched portion around the contact hole may be uniformly arranged by the cleaning.

The silicon oxide film (SiOx) and/or silicon nitride film (SiNx) forming the second protective layer 750 may be easily corroded by the BOE or the like used as the cleaning liquid in the cleaning process. Accordingly, a portion of a side surface of the pin layer PIN may be exposed to the outside through the second protective layer 750 etched during the cleaning process, and thereby, a leakage current may occur. In the present invention, the self-assembled monofilm SAM' robust to wet etching is formed on the second protective layer 750 before the cleaning process, and thereby, the second protective layer 750 may be prevented from being damaged in the cleaning process.

Figure 13:
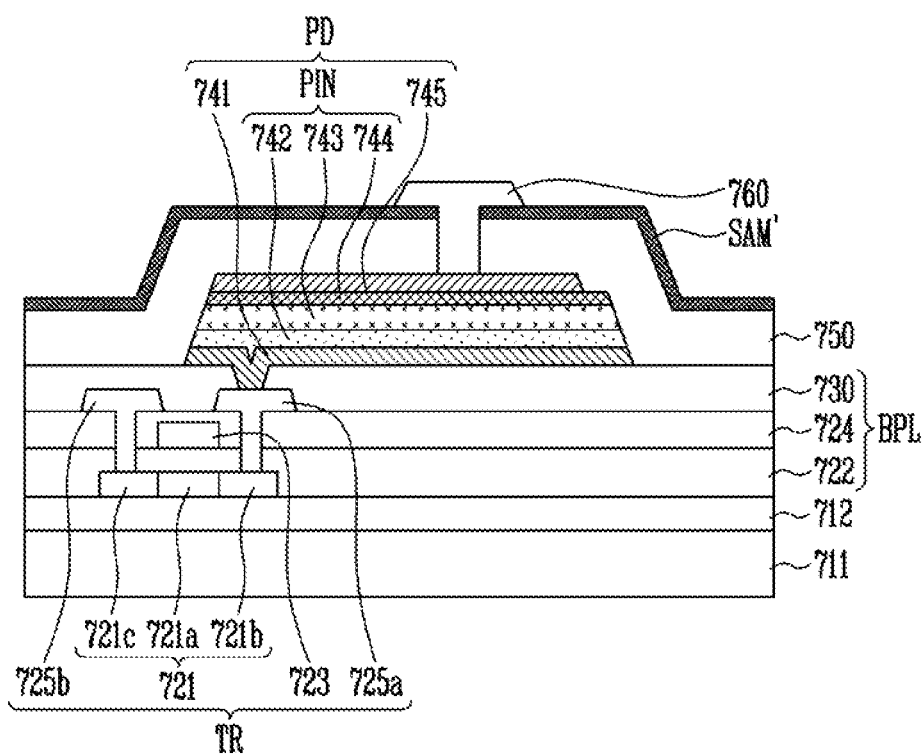
Figure 14:
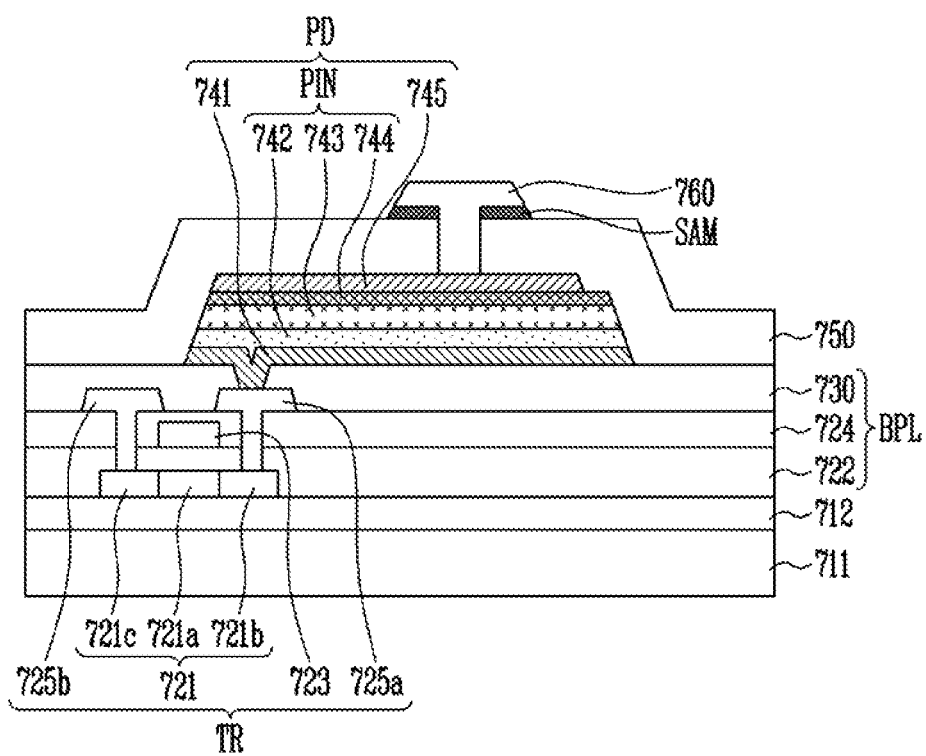

Next, as illustrated in FIG. 13, the bias electrode 760 connected to the upper electrode 745 of the photoelectric element PD through the contact hole of the second protective layer 750 is formed. In addition, the bias electrode 760 is formed on the self-assembled monofilm SAM'. Subsequently, as illustrated in FIG. 14, if the substrate 711 is subjected to oxygen plasma treatment, the self-assembled monofilm SAM' exposed in a region, where the bias electrode 760 is not formed, is etched. A residual self-assembled monofilm SAM' that is not etched by the plasma processing may form the self-assembled monolayer SAM between the second protective layer 750 and the bias electrode 760.

Figure 15:
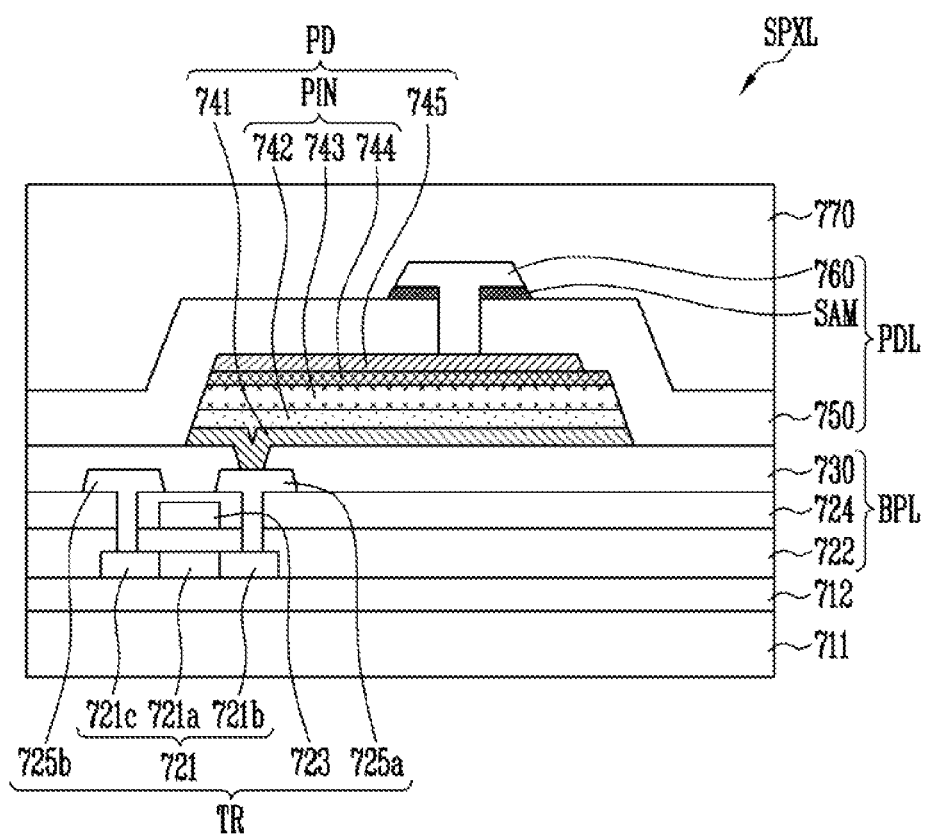

Additionally, as illustrated in FIG. 15, the planarization layer 770 may be further formed. According to an exemplary embodiment of the present invention, before the planarization layer 770 is formed, a third protective layer may be further formed to cover the second protective layer 750 on which the bias electrode 760 is formed.

Figure 16:
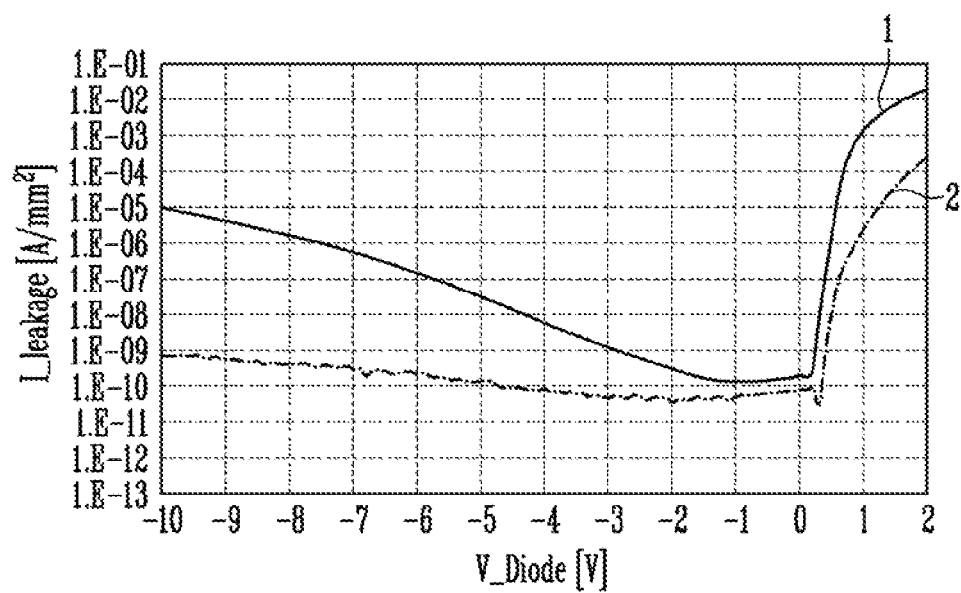
FIG. 16 is a graph illustrating a leakage current of a PIN diode according to a drive voltage of the optical sensor.

FIG. 16 is a graph illustrating a leakage current of a PIN diode according to a drive voltage of an optical sensor.

For example, FIG. 16 illustrates a leakage current I_leakage for each drive voltage V_diode of the PIN diode as the photoelectric element PD, when a contact hole is formed in the second protective layer 750 without forming the self-assembled monofilm SAM' and a cleaning process is performed as in a comparative example, and when the contact hole is formed and the cleaning process is performed after the self-assembly monofilm SAM' is formed on the second protective layer 750 as in the present invention.

The PIN diode may be driven by a voltage of about −7 to about −3V. Referring to FIGS. 7 to 15, if the contact hole is formed in the second protective layer 750 and the BOE cleaning process is performed in a state where the self-assembled monofilm SAM' is not formed, a portion of the second protective layer 750 may be corroded by a chemical reaction with a cleaning solution. In this case, if a part of the pin layer PIN of the PIN diode is exposed or at least a thickness of the second protective layer 750 is reduced, a current may leak into the exposed region when the PIN diode is driven. In such a case, a significant amount of leakage current I_leakage may occur as illustrated in a first graph 1. The leakage current I_leakage acts as a noise to a sensing current of the PIN diode, and thereby, a sensing accuracy may be reduced.

In the present invention, if the contact hole is formed and the cleaning process is performed after the self-assembly monofilm SAM' is formed on the second protective layer 750, the second protective layer 750 might not be exposed to the cleaning liquid by the self-assembly monofilm SAM' robust to wet etching, and thus, corrosion might not occur. Then, as illustrated in a second graph 2, the leakage current I_leakage may be reduced when the PIN diode is driven, and as a result, a sensing accuracy may be increased.

The present invention provides an optical sensor, a method of manufacturing the optical sensor, and a display device including the optical sensor capable of preventing an insulating layer, which shields the PIN diode having a vertical structure during a cleaning process, from being etched.

An optical sensor, a method of manufacturing the optical sensor, and a display device including the optical sensor according to an exemplary embodiment of the present invention may minimize an occurrence of a leakage current in a PIN diode having a vertical structure.

The optical sensor, the method of manufacturing the optical sensor, and the display device including the optical sensor according to an exemplary embodiment of the present invention may prevent the leakage current of the PIN diode from occurring, thereby, reducing a noise acting on a sensing current and as a result, an accuracy of fingerprint sensing may be increased.

While the present invention has been particularly shown and described with reference to exemplary embodiments thereof, it will be apparent to those of ordinary skill in the art that various changes in form and detail may be made thereto without departing from the spirit and scope of the present invention

What is claimed is:

1. An optical sensor comprising:
a substrate;
a circuit element layer disposed on the substrate and including a circuit element; and
a photoelectric element layer including a photoelectric element, a self-assembled monolayer, and a bias electrode connected to the photoelectric element, wherein the photoelectric element is connected to the circuit element,
wherein the self-assembled monolayer is disposed on the photoelectric element,
  wherein a protective layer is disposed between the photoelectric element and a portion of the bias electrode, and
wherein the photoelectric element includes:
a lower electrode connected to the circuit element;
a P-Intrinsic-N(PIN) layer disposed on the lower electrode; and
an upper electrode disposed on the PIN layer and connected to the bias electrode.

2. The optical sensor of claim 1,
wherein the photoelectric element layer further includes the protective layer covering the upper electrode, and
wherein the bias electrode is formed on the protective layer and is connected to the upper electrode through a contact hole formed in the protective layer.

3. The optical sensor of claim 2, wherein the self-assembled monolayer is formed between the protective layer and the bias electrode.

4. The optical sensor of claim 1, wherein the PIN layer includes:
an N-type semiconductor layer disposed on the lower electrode;
an I-type semiconductor layer formed on the N-type semiconductor layer; and
a P-type semiconductor layer formed on the I-type semiconductor layer.

5. The optical sensor of claim 1, wherein the circuit element layer includes:
an active pattern having a channel region, and a source region and a drain region on opposing sides of the channel region, respectively;
a gate insulating layer covering the active pattern;
a gate electrode formed on the gate insulating layer, wherein at least a part of the gate electrode overlaps the channel region;
an interlayer insulating layer covering the gate electrode;
a source electrode and a drain electrode formed on the interlayer insulating layer and respectively connected to the source region and the drain region through contact holes; and
a protective layer covering the source electrode and the drain electrode.

6. The optical sensor of claim 1, further comprising:
a planarization layer formed on the photoelectric element layer.

7. A display device comprising:
a display panel including pixels; and
an optical sensor disposed on the display panel and including a plurality of sensor pixels,
wherein each of the plurality of sensor pixels includes:
a first substrate;
a first circuit element layer disposed on the first substrate and including a first circuit element configuring the plurality of sensor pixels; and
a photoelectric element layer including a photoelectric element, a self-assembled monolayer, and a bias electrode connected to the photoelectric element, wherein the photoelectric element s connected to the first circuit element,
wherein the bias electrode overlaps the self-assembled monolayer, and
wherein the photoelectric element includes:
a lower electrode connected to the first circuit element;
a P-Intrinsic-N(PIN) layer disposed on the lower electrode; and
an upper electrode disposed on the PIN layer and connected to the bias electrode.

8. The display device of claim 7,
wherein the photoelectric element layer further includes a first protective layer covering the upper electrode, and
wherein the bias electrode is formed on the first protective layer and is connected to the upper electrode through a contact hole formed in the first protective layer.

9. The display device of claim 8, wherein the self-assembled monolayer is formed between the first protective layer and the bias electrode.

10. The display device of claim 7, wherein the display panel includes:
a second substrate;
a second circuit element layer disposed on the second substrate and including a second circuit element configuring the pixels;
a light emitting element layer formed on the second circuit element layer and including light emitting elements forming the plurality of pixels; and
a second protective layer formed on the light emitting element layer.

11. The display device of claim 10, wherein the display panel further includes a light blocking layer disposed between the second substrate and the second circuit element layer and including openings through which incident light passes.

* * * * *